(12) United States Patent
Chang

(10) Patent No.: US 7,615,487 B2
(45) Date of Patent: Nov. 10, 2009

(54) POWER DELIVERY PACKAGE HAVING THROUGH WAFER VIAS

(75) Inventor: Shih-Cheng Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 203 days.

(21) Appl. No.: 11/724,282

(22) Filed: Mar. 15, 2007

(65) Prior Publication Data
US 2008/0224330 A1   Sep. 18, 2008

(51) Int. Cl.
*H01L 21/44* (2006.01)
*H01L 29/40* (2006.01)

(52) U.S. Cl. ...................... 438/667; 257/774

(58) Field of Classification Search ......... 438/461, 438/611, 666–669; 257/775–781, E21.597
See application file for complete search history.

(56) References Cited

U.S. PATENT DOCUMENTS 6,924,551 B2 * 8/2005 Rumer et al. .......... 257/688
6,967,556 B2 * 11/2005 Gaschke et al. .......... 336/200
2005/0184390 A1 * 8/2005 Gagne et al. .......... 257/738
2007/0176281 A1 * 8/2007 Kim et al. .......... 257/700
2007/0220207 A1 * 9/2007 Black et al. .......... 711/118
2008/0179758 A1 * 7/2008 Wong et al. .......... 257/778

FOREIGN PATENT DOCUMENTS

JP   2006-228897 A   8/2006

\* cited by examiner

*Primary Examiner*—Calvin Lee
(74) *Attorney, Agent, or Firm*—Birch, Stewart, Kolasch & Birch, LLP

(57) ABSTRACT

An integrated circuit chip package and a method of manufacture thereof are provided. In one embodiment, the integrated circuit chip package comprises a semiconductor die having power and ground routings, a plurality of through wafer vias disposed within the semiconductor die, the through wafer vias connected to the power and ground routings, and a substrate attached to the semiconductor die, the substrate having power and ground leads connected to the through wafer vias for transferring power from the substrate to the semiconductor die.

15 Claims, 1 Drawing Sheet

POWER DELIVERY PACKAGE HAVING THROUGH WAFER VIAS

BACKGROUND

The present invention relates generally to the fabrication of semiconductor devices, and more particularly, to semiconductor devices having through wafer vias for making electrical connections with other semiconductor components.

Modern semiconductor devices comprise of thousands or even millions of components (e.g., transistors, interconnects, pads, etc.) integrated into a single die. As customer demand improves chip performance, new requirements are placed on the die, and consequently the packaging that houses the die. Critical packaging parameters include the number of input and output (I/O) pins, electrical performance, thermal dissipation, and size.

Traditionally, after each good die is separated from the wafer, the die is attached to a package substrate or leadframe to provide electrical access to the die. Wirebonding is the most common method for electrically connecting bond pads on the chip surface to the package inner lead terminals on the package substrate. "Flip chip" is another way of connecting the die to the package substrate where the active side of the chip (with the surface bonding pads) is mounted toward the substrate (e.g., upside down placement of the bumped die relative to the wirebonding approach). An extension of flip chip, ball grid array (BGA), yet another way of attaching a die to the package substrate, uses flip chip C4 (controlled collapse chip carrier—developed by IBM in the 1960s) or wirebond technology.

However, these traditional approaches suffer from assembly and packaging challenges. Because the power and ground interconnections are typically connected from the bond pads on the top metals of the chip to the package substrate below, the circuit resistance is increased, which potentially increases the circuit length and the inter-electrode capacitance thus affecting the electrical performance. Due to these configurations, these packages typically require more power and increased I/O lead requirements leading to increased chip size and overall profile.

For these reasons and other reasons that will become apparent upon reading the following detailed description, there is a need for an improved semiconductor device and a method of manufacture thereof that addresses the above-discussed issues.

SUMMARY

The present invention is directed to an integrated circuit chip package and a method of manufacture thereof. In one embodiment, the integrated circuit chip package comprises a semiconductor die having power and ground routings, a plurality of through wafer vias disposed within the semiconductor die, the through wafer vias connected to the power and ground routings, and a substrate attached to the semiconductor die, the substrate having power and ground leads connected to the through wafer vias for transferring power from the substrate to the semiconductor die.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

Figure 1:
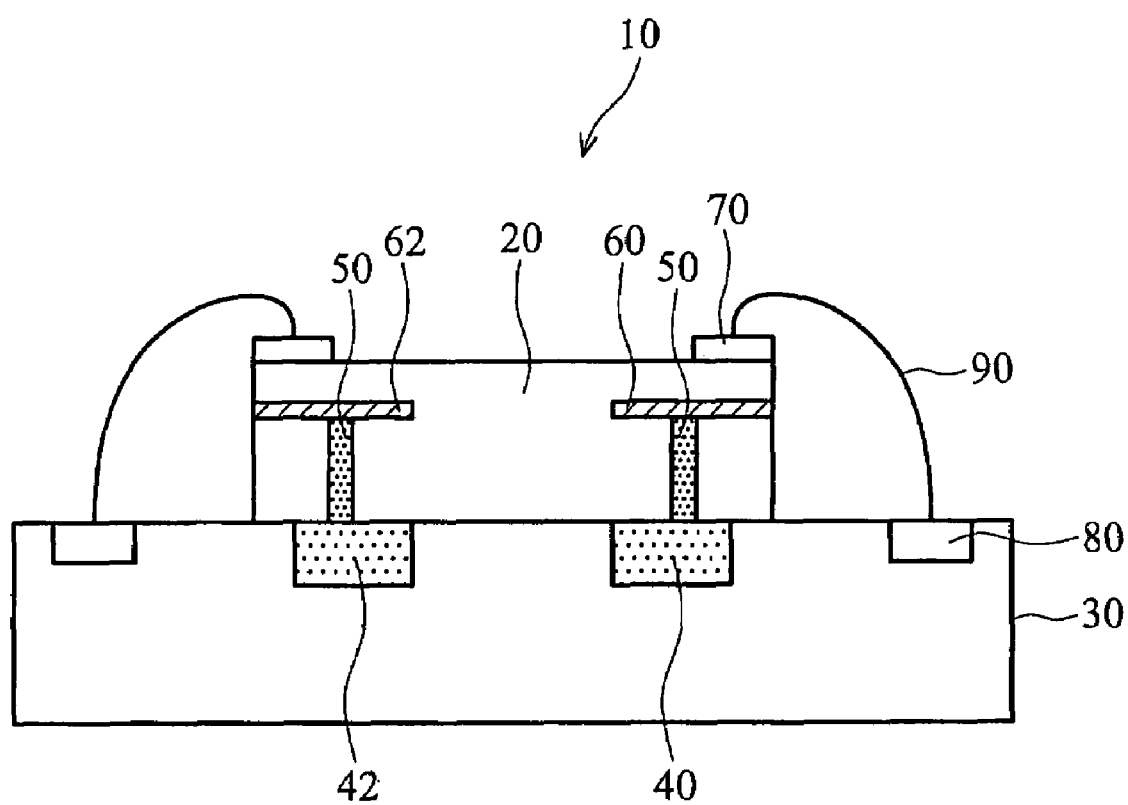
FIG. 1 is a cross-sectional view of an integrated circuit chip packaging according to one embodiment of the present invention.

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" in various places throughout this specification are not necessarily all referring to the same embodiment. Furthermore, the particular features, structures, or characteristics may be combined in any suitable manner in one or more embodiments. Additionally, it should be appreciated that the following figures are not drawn to scale; rather, these figures are merely intended for illustration.

Referring to FIG. 1, illustrated is a cross-sectional view of an integrated circuit chip packaging according to one embodiment of the present invention. Integrated circuit package 10 includes a semiconductor device, such as semiconductor die 20. Semiconductor die 20 includes circuit components (not shown) such as logic elements, transistors, memory elements, redistribution elements, bonding pads, etc. integrated within the die or on a surface of the die. Semiconductor die 20 also contains a plurality of through wafer vias 50 disposed therewithin. As is known to those skilled in the art, through wafer vias are formed by a variety of techniques, such as, for example, a laser process, a dry etch process, a photoelectrochemical process, etc. or a combination of these processes. Simplistically, through wafer vias are vias that are first formed in the die and then filled with metal layers to enable electrical interconnection between circuit components (e.g. bond pads, etc.) integrated into the die and power and ground leads in package substrates. These through wafer vias 50 are connected to power and ground routings 60 and 62, respectively for supplying electrical power to these circuit components. The size, shape, and configuration such as the width and depth of the through wafer vias 50 may vary depending upon the particular application.

Semiconductor die 20 is bonded to a package substrate 30 or leadframe by conventional chip bonding techniques, such as, for example, epoxy attach (adhesive), eutectic attach, or glass frit attach. Package substrate 30 may be a printed wire board (also sometimes called a printed circuit board), a multilayer module or other semiconductor substrates as is known to those skilled in the art. Package substrate 30 comprises power and ground leads 40 and 42, respectively which are connected directly to the through wafer vias 50 for transferring power from the package substrate 30 to the semiconductor die 20. Leads 80 on package substrate 30 allow bond wires 90 to be attached to bond pads 70 on semiconductor die 20 for electrically connecting the semiconductor die 20 to package substrate 30. Although bonding wires are employed to electrically couple semiconductor die 20 to package substrate 30 as illustrated in FIG. 1, any number of means for coupling the chip to the substrate such as by way of solder bumps or ball grid array (BGA) as is known to those skilled in the art are within the scope of the present disclosure.

After die assembly and attachment to the substrate, the die is enclosed in a protective package, not shown in FIG. 1. The most common package in use today is the encapsulation of the chip with a plastic molding compound. This plastic package provides environmental protection for the chip.

Although FIG. 1 only illustrates a single chip bonded to the package substrate, the techniques described therein may be used to electrically interconnect circuit components on two or more chips by stacking them together as is known to those skilled in the art in order to maximize the number of components within a single device. Further, any number of through wafer vias may be formed on and/or through the semiconductor die using the techniques described above.

The integrated circuit chip packaging of the present invention has a number of advantages over conventional chip packaging. Unlike conventional packaging where power and ground interconnections are connected from bond pads on top metals of the chip to the package substrate below, in the present invention power is delivered directly from the package substrate to the backside of the chip by using electrically conductive through wafer vias embedded within the chip. As the circuit length is shortened and both the circuit resistance and inter-electrode capacitance are decreased, less power and reduced I/O lead requirements are needed, decreasing overall device package profile. Accordingly, such vias have advantages for space improvement and efficiency. Moreover, unlike the high costs associated with manufacturing bumps for powering a chip, through wafer vias can be fabricated in a high volume manufacturing method using bulk micromachining, thus saving costs.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method comprising:
   providing a semiconductor die having power and ground routings connected to circuit components;
   forming a plurality of through wafer vias disposed within the semiconductor die, the through wafer vias connected to the power and ground routings; and
   providing a substrate attached to the semiconductor die, the substrate having power and ground leads connected directly to the through wafer vias for transferring power from the substrate to the circuit components.

2. The method of claim 1, wherein the semiconductor die is attached to the substrate by an adhesive.

3. The method of claim 1, wherein the substrate comprises a printed circuit board.

4. The method of claim 1, further comprising bond wires for establishing electrical connection between the semiconductor die and the substrate.

5. The method of claim 1, wherein the die, the substrate, and bond wires are substantially encapsulated with a molding compound.

6. A semiconductor device, comprising:
   a semiconductor die having power and ground routings connected to circuit components;
   a plurality of through wafer vias disposed within the semiconductor die, the through wafer vias connected to the power and ground routings; and
   a substrate attached to the semiconductor die, the substrate having power and ground leads connected directly to the through wafer vias for transferring power from the substrate to the circuit components.

7. The semiconductor device of claim 6, wherein the semiconductor die is attached to the substrate by an adhesive.

8. The semiconductor device of claim 6, wherein the substrate comprises a printed circuit board.

9. The semiconductor device of claim 6, further comprising bond wires for establishing electrical connection between the semiconductor die and the substrate.

10. The semiconductor device of claim 6, wherein the die, the substrate, and bond wires are substantially encapsulated with a molding compound.

11. An integrated circuit chip package, comprising:
    a semiconductor die having power and ground routings connected to circuit components;
    a plurality of through wafer vias disposed within the semiconductor die, the through wafer vias connected to the power and ground routings; and
    a substrate attached to the semiconductor die, the substrate having power and ground leads connected directly to the through wafer vias for transferring power from the substrate to the circuit components.

12. The integrated circuit chip package of claim 11, wherein the semiconductor die is attached to the substrate by an adhesive.

13. The integrated circuit chip package of claim 11, wherein the substrate comprises a printed circuit board.

14. The integrated circuit chip package of claim 11, further comprising bond wires for establishing electrical connection between the semiconductor die and the substrate.

15. The integrated circuit chip package of claim 11, wherein the die, the substrate, and bond wires are substantially encapsulated with a molding compound.

* * * * *